US008962234B2

United States Patent
Ohnishi et al.

(10) Patent No.: US 8,962,234 B2
(45) Date of Patent: Feb. 24, 2015

(54) RESIST UNDERLAYER FILM FORMING COMPOSITION AND METHOD FOR FORMING RESIST PATTERN USING THE SAME

(75) Inventors: Ryuji Ohnishi, Toyama (JP); Takafumi Endo, Toyama (JP); Rikimaru Sakamoto, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 25 days.

(21) Appl. No.: 14/003,480

(22) PCT Filed: Mar. 8, 2012

(86) PCT No.: PCT/JP2012/055963
§ 371 (c)(1),
(2), (4) Date: Sep. 6, 2013

(87) PCT Pub. No.: WO2012/124597
PCT Pub. Date: Sep. 20, 2012

(65) Prior Publication Data
US 2014/0004465 A1 Jan. 2, 2014

(30) Foreign Application Priority Data
Mar. 15, 2011 (JP) .................. 2011-056593

(51) Int. Cl.
*G03F 7/004* (2006.01)
*G03F 7/11* (2006.01)
*C08G 63/60* (2006.01)

(52) U.S. Cl.
USPC .................. 430/271.1; 430/270.1; 430/311; 524/605

(58) Field of Classification Search
USPC .................. 430/270.1, 271.1, 311; 524/605
See application file for complete search history.

(56) References Cited

U.S. PATENT DOCUMENTS 7,425,399 B2 *  9/2008  Kishioka et al. ........... 430/270.1
7,736,822 B2 *  6/2010  Hashimoto et al. .......... 430/5
(Continued)

FOREIGN PATENT DOCUMENTS

EP   1484645 A1 * 12/2004
JP   A-2004-250377    9/2004
(Continued)

OTHER PUBLICATIONS

International Search Report issued in International Application No. PCT/JP2012/055963 dated Apr. 10, 2012.
(Continued)

Primary Examiner — Amanda C. Walke
(74) Attorney, Agent, or Firm — Oliff PLC

(57) ABSTRACT

A resist underlayer film forming composition for lithography, includes: a polymer including a structure of formula (1) below at a terminal of a polymer chain; a cross-linking agent; a compound that promotes a cross-linking reaction; and an organic solvent:

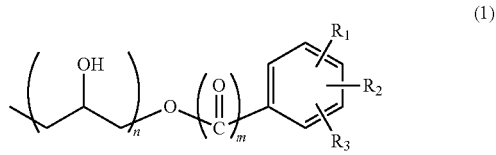

(where $R_1$, $R_2$, and $R_3$ are each independently a hydrogen atom, a linear or branched hydrocarbon group having a carbon atom number of 1 to 13, or a hydroxy group; at least one of $R_1$, $R_2$, and $R_3$ is the hydrocarbon group; m and n are each independently 0 or 1; and a main chain of the polymer is bonded to a methylene group when n is 1 and bonded to a group represented by —O— when n is 0).

9 Claims, 3 Drawing Sheets

(56) References Cited

U.S. PATENT DOCUMENTS

| | | | |
|---|---|---|---|
| 8,445,175 B2 * | 5/2013 | Hiroi et al. | 430/271.1 |
| 8,603,731 B2 * | 12/2013 | Enomoto et al. | 430/296 |
| 8,722,840 B2 * | 5/2014 | Sakamoto et al. | 528/99 |
| 2005/0148170 A1 | 7/2005 | Bhave et al. | |
| 2009/0317740 A1 * | 12/2009 | Hiroi et al. | 430/270.1 |
| 2010/0221657 A1 * | 9/2010 | Sakamoto et al. | 430/270.1 |
| 2010/0266951 A1 * | 10/2010 | Hiroi et al. | 430/270.1 |
| 2011/0033800 A1 | 2/2011 | Zampini et al. | |
| 2012/0251955 A1 * | 10/2012 | Sakamoto et al. | 430/296 |
| 2014/0099791 A1 * | 4/2014 | Sakamoto et al. | 438/694 |

FOREIGN PATENT DOCUMENTS

| | | | |
|---|---|---|---|
| JP | A-2007-513491 | | 5/2007 |
| JP | 2007246638 A | * | 9/2007 |
| JP | A-2009-175436 | | 8/2009 |
| JP | A-2010-181453 | | 8/2010 |
| JP | 2010231050 A | * | 10/2010 |
| JP | A-2011-042645 | | 3/2011 |
| WO | WO 2005/038878 A2 | | 4/2005 |
| WO | WO 2005/098542 A1 | | 10/2005 |
| WO | WO 2006088230 A1 | * | 8/2006 |
| WO | WO 2009/096340 A1 | | 8/2009 |
| WO | WO 2009/104685 A1 | | 8/2009 |
| WO | WO 2010/061774 A1 | | 6/2010 |

OTHER PUBLICATIONS

Translation of Written Opinion of the International Searching Authority issued in International Application No. PCT/JP2012/055963 dated Apr. 10, 2012.

* cited by examiner

RESIST UNDERLAYER FILM FORMING COMPOSITION AND METHOD FOR FORMING RESIST PATTERN USING THE SAME

TECHNICAL FIELD

The present invention relates to a resist underlayer film forming composition for lithography that can be formed into a defect-free uniform film even when a resist underlayer film having a thin film thickness (20 nm or less, for example) is formed and relates to a method for forming a resist pattern using the resist underlayer film forming composition.

BACKGROUND ART

Conventionally, in the production of semiconductor devices, microfabrication has been carried out by lithography using a resist composition. The microfabrication is a fabrication process in which a thin film of a photoresist composition is formed on a semiconductor substrate such as a silicon wafer, active rays such as ultraviolet rays are radiated onto the film for development through a mask pattern in which a pattern of a device is depicted, and the substrate is etched using the obtained photoresist pattern as a protective film to form a fine concave-convex corresponding to the pattern on the surface of the substrate. In recent years, semiconductor devices have been further integrated, and active rays to be used have changed from an i-line (365 nm wavelength) and a KrF excimer laser (248 nm wavelength) to an ArF excimer laser (193 nm wavelength) having a shorter wavelength. Such a change raises major issues of influence of irregular reflection of active rays from a semiconductor substrate and standing wave. To address the issues, a method for providing an anti-reflective coating (bottom anti-reflective coating, BARC) between a resist and a semiconductor substrate has been widely studied. The anti-reflective coating is also called a resist underlayer film. For such anti-reflective coatings, many studies have been performed regarding organic anti-reflective coatings formed from a polymer having a light absorbing moiety or the like because of the easy availability and the like.

Patent Documents 1 to 3 disclose resist underlayer films (anti-reflective coatings) which cause no intermixing with photoresist films formed on the top of the resist underlayer films and with which desired optical parameters (k value and n value) can be obtained when the resist underlayer films are exposed to an ArF excimer laser, and also a desired dry etching rate can be obtained.

On the other hand, in lithography employing EUV (abbreviation of extreme ultraviolet rays, 13.5 nm wavelength) exposure that is a further microfabrication technique, although no reflection occurs from the substrate, finer patterning causes an issue of roughness on the side wall of a resist pattern. For this reason, many studies have been performed regarding a resist underlayer film for forming a resist pattern close to a precise rectangular shape. A composition for forming a resist underlayer film with reduced outgassing is disclosed as a material for forming a resist underlayer film for high-energy radiation of EUV, X-rays, electron beams, and the like (Patent Document 4).

PRIOR ART DOCUMENTS

Patent Documents

Patent Document 1: WO 2005/098542 pamphlet
Patent Document 2: WO 2009/096340 pamphlet
Patent Document 3: WO 2009/104685 pamphlet
Patent Document 4: WO 2010/061774 pamphlet

SUMMARY OF THE INVENTION

Problem to be Solved by the Invention

Examples of properties required for the resist underlayer film include causing no intermixing with a resist film to be formed on the top of the resist underlayer film (insoluble in a resist solvent) and a larger dry etching rate than that of the resist film.

In lithography employing EUV exposure, the width of a pattern line is formed to be 32 nm or less, and a resist underlayer film for EUV exposure is formed to be used so as to have a smaller film thickness than that of a conventional film. Pinholes, aggregations, and other defects likely occur in the formation of such a thin film due to the influence of the surface of a substrate, a polymer to be used, or the like, and thus, it is difficult to form a defect-free uniform film.

It is an object of the present invention to provide a composition for forming a resist underlayer film, with which a desired resist pattern can be formed by overcoming the disadvantages.

Means for Solving the Problem

The present invention provides, according to a first aspect, a resist underlayer film forming composition for lithography, comprising: a polymer including a structure of formula (1) below at a terminal of a polymer chain; a cross-linking agent; a compound that promotes a cross-linking reaction; and an organic solvent:

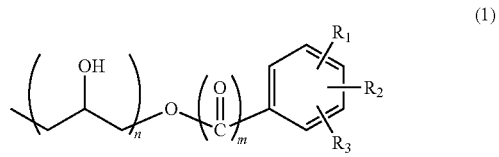

(1)

(where $R_1$, $R_2$, and $R_3$ are each independently a hydrogen atom, a linear or branched hydrocarbon group having a carbon atom number of 1 to 13, or a hydroxy group; at least one of $R_1$, $R_2$, and $R_3$ is the hydrocarbon group; m and n are each independently 0 or 1; and a main chain of the polymer is bonded to a methylene group when n is 1 and bonded to a group represented by —O— when n is 0).

When m is 0 in formula (1), a carbonyl group does not exist, and the group represented by —O— that is an ether bond is directly bonded to a benzene ring.

The present invention relates to, according to a second aspect, a method for forming a resist pattern, the method comprising: applying the resist underlayer film forming composition for lithography of the present invention onto a semiconductor substrate to be baked and forming a resist underlayer film having a thickness of 1 nm to 20 nm; forming a resist film on the resist underlayer film; exposing the semiconductor substrate coated with the resist underlayer film and the resist film to radiation selected from the group consisting of a KrF excimer laser, an ArF excimer laser, extreme ultraviolet rays (EUV), and electron beams; and performing development with an alkaline liquid developer after the exposing.

Effects of the Invention

The resist underlayer film forming composition for lithography of the present invention is characterized in that the terminal of the polymer contained in the resist underlayer film forming composition is capped with the structure of formula (1), and is a composition containing such a polymer, the cross-linking agent, the compound that promotes a cross-linking reaction; and the organic solvent. Such a composition can improve coating properties and enables a defect-free uniform resist underlayer film to be formed.

MODES FOR CARRYING OUT THE INVENTION

[Polymer]

Figure 1:
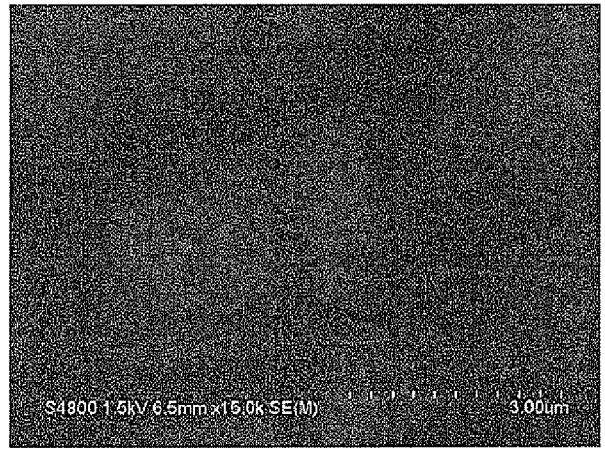
FIG. 1 is a FE-SEM image of a resist underlayer film formed from a composition prepared in Example 1.

The polymer contained in the resist underlayer film forming composition for lithography of the present invention includes the structure of formula (1) at the terminal of the polymer chain. In formula (1), at least one of $R_1$, $R_2$, and $R_3$ is a linear or branched hydrocarbon group having a carbon atom number of 1 to 13. As the hydrocarbon group, an alkyl group such as a tert-butyl group, an iso-propyl group, and a methyl group is preferable in improving the solubility of the polymer and the coating properties of the composition, and among these, a tert-butyl group and an iso-propyl group are particularly preferable.

The polymer includes, for example, structural units of formulae (2) and (3):

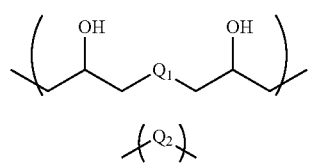

(where $Q_1$ and $Q_2$ are each independently a divalent organic group having a linear or branched hydrocarbon group having a carbon atom number of 1 to 13, a divalent organic group having an alicyclic hydrocarbon group, or a divalent organic group having an aromatic ring or a heterocycle including 1 to 3 nitrogen atoms; and the hydrocarbon group, the alicyclic hydrocarbon group, the aromatic ring, and the heterocycle optionally have at least one substituent).

The structural unit of formula (2) is represented by, for example, formula (2'):

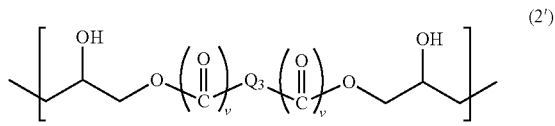

(where $Q_3$ is a linear or branched hydrocarbon group having a carbon atom number of 1 to 13, an alicyclic hydrocarbon group, or an aromatic ring; the hydrocarbon group, the alicyclic hydrocarbon group, and the aromatic ring optionally have at least one substituent; and two v are each independently 0 or 1).

The hydrocarbon group, the alicyclic hydrocarbon group, and the aromatic ring optionally have, as the substituent, at least one methyl group, hydroxy group, or fluoro group.

The structural unit of formula (3) is represented by, for example, formula (3'):

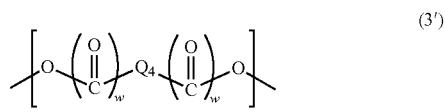

(where $Q_4$ is a linear or branched hydrocarbon group having a carbon atom number of 1 to 13, an alicyclic hydrocarbon group, or an aromatic ring; the hydrocarbon group, the alicyclic hydrocarbon group, and the aromatic ring optionally have at least one substituent; the hydrocarbon group optionally has one or two sulfur atoms and optionally has a double bond in the main chain thereof; and two w are each independently 0 or 1).

Examples of the substituent for the linear or branched hydrocarbon group include a hydroxy group and a fluoro group. Examples of the substituent for the alicyclic hydrocarbon group, the aromatic ring, and the heterocycle include a methyl group, an ethyl group, a tert-butyl group, an allyl group, a hydroxy group, and a fluoro group. Examples of the alicyclic hydrocarbon group include a cyclobutylene group, a cyclopentylene group, and a cyclohexylene group. Examples of the aromatic ring include a benzene ring, a naphthalene ring, and an anthracene ring. Examples of the heterocycle include a triazinetrione ring, a pyrimidinetrione ring, an imidazolidinedione ring, an imidazolidone ring, and a pyridone ring.

Examples of a monomer forming the structure of formula (1) include compounds of formulae (1-1) to (1-9):

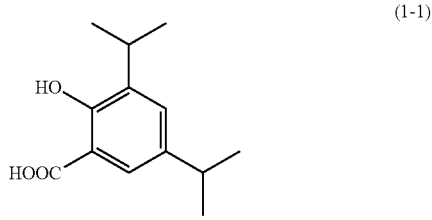

(1-2) 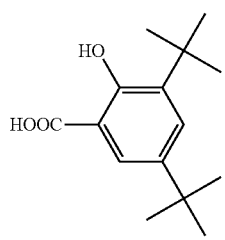
(1-3) 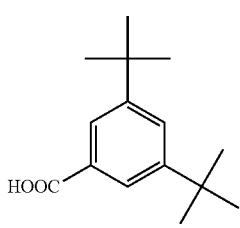
(1-4) 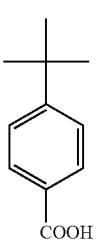
(1-5) 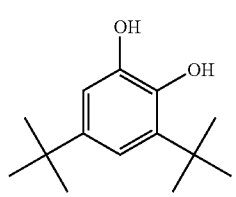
(1-6) 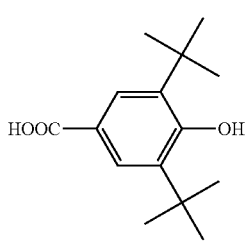
(1-7) 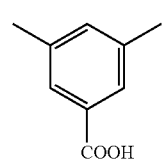
(1-8) 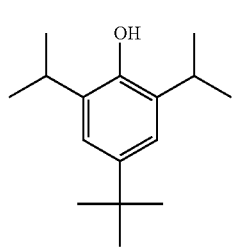
(1-9) 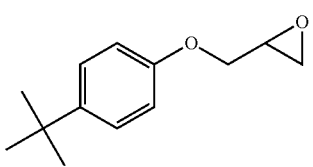
Examples of a monomer forming the structural unit of formula (2) include compounds each of which has two epoxy groups, of formulae (2-1) to (2-16):
(2-1) 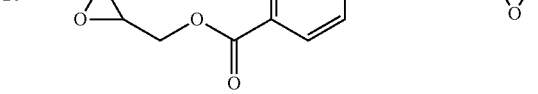
(2-2) 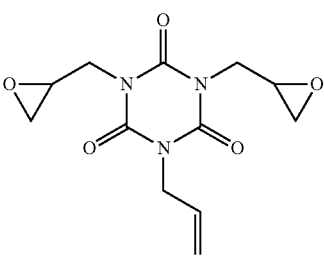
(2-3) 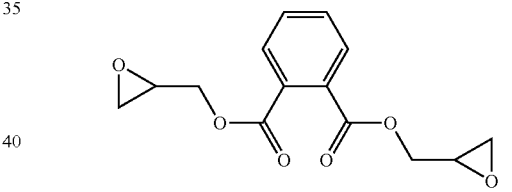
(2-4) 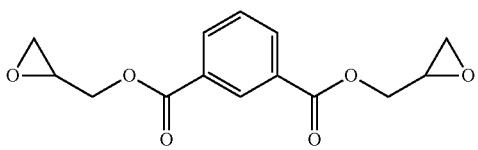
(2-5) 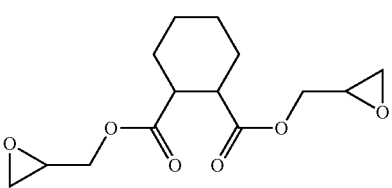
(2-6) 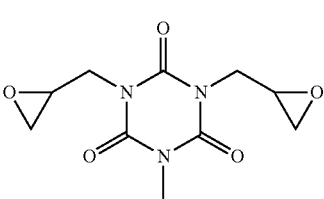

(2-7)
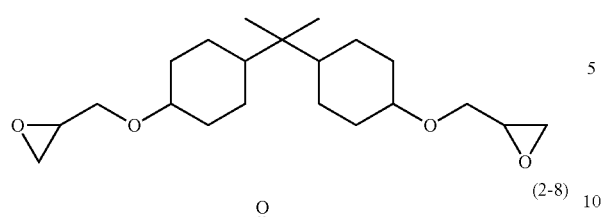
(2-8)
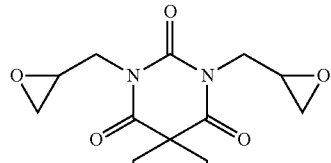
(2-9)
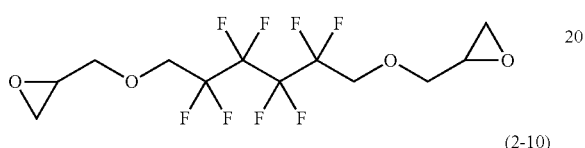
(2-10)
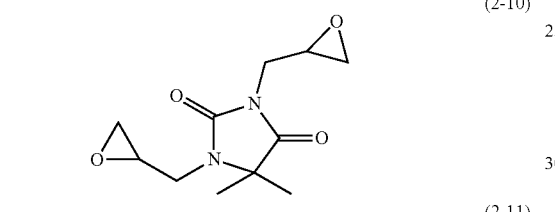
(2-11)
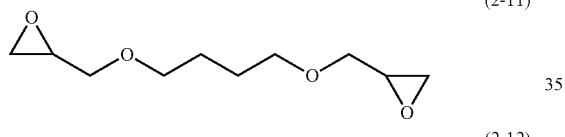
(2-12)
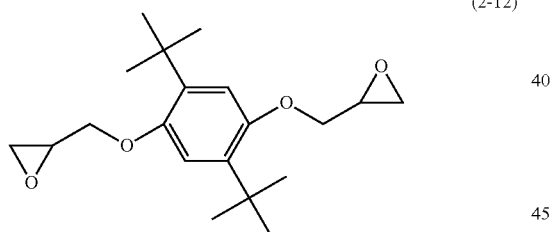
(2-13)
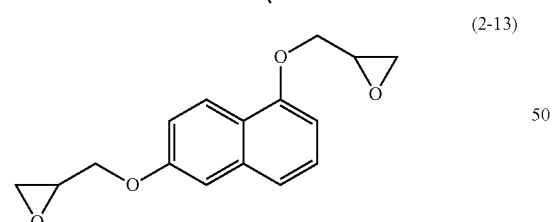
(2-14)
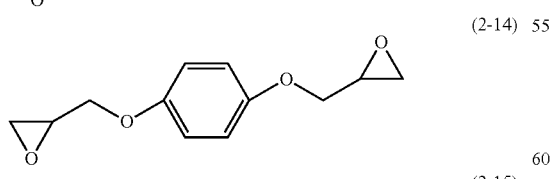
(2-15)
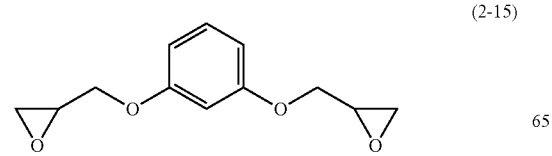
(2-16)
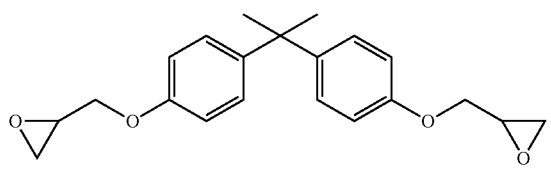
Examples of a monomer forming the structural unit of formula (3) include compounds of formulae (3-1) to (3-10):
(3-1)
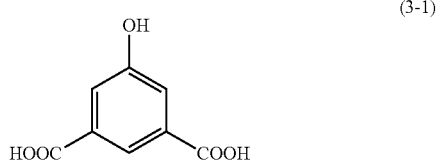
(3-2)
(3-3)
(3-4)
(3-5)
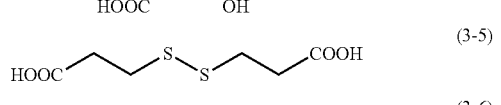
(3-6)
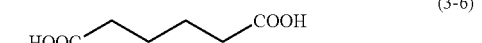
(3-7)
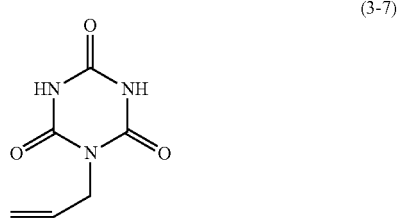
(3-8)
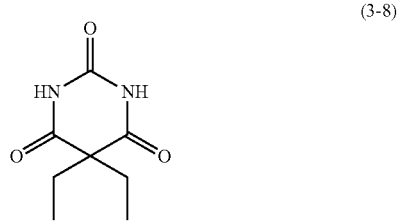
(3-9)
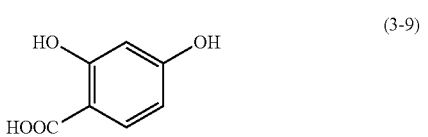

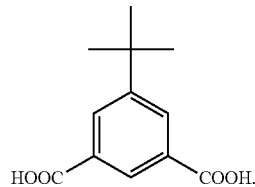

(3-10)

The polymer contained in the resist underlayer film forming composition for lithography of the present invention is represented by, for example, formula (4):

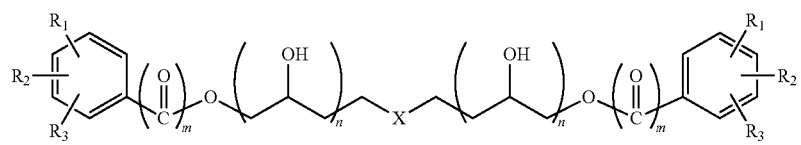

(4)

(where $R_1$, $R_2$, and $R_3$ mean the same as those of formula (1); two in and two n are each independently 0 or 1; and X is a polymer chain having the structural unit of formulae (2) and (3)).

Formula (4) represents that the terminal of the polymer chain is capped with the structure of formula (1).

A monomer forming the structure of formula (1) required for obtaining the polymer of formula (4) is in a proportion of, for example, 1% by mass to 30% by mass (in terms of the charging ratio of the monomers) and preferably 2% by mass to 20% by mass per 100% by mass of the total of the monomers forming the structural units of formulae (2) and (3).

The polymer contained in the resist underlayer film forming composition for lithography of the present invention may be any of a random copolymer, a block copolymer, an alternating copolymer, and a graft copolymer. The polymerization method of the polymer can employ various methods such as solution polymerization, suspension polymerization, emulsion polymerization, and bulk polymerization and may use a polymerization catalyst or the like as needed.

As an example of the polymerization method, the polymer can be synthesized by adding, in an organic solvent, the monomer forming the structure of formula (1) and a polymerization catalyst into the monomer forming the structural unit of formula (2) and the monomer forming the structural unit of formula (3) and performing thermal polymerization. The organic solvent used in this method can be appropriately selected from the preferable examples of the organic solvent, which is described below, contained in the resist underlayer film forming composition for lithography of the present invention. Examples of the polymerization catalyst include benzyltriethylammonium chloride and ethyltriphenylphosphonium bromide. The polymerization can be performed by heating at, for example, 50° C. to 160° C. and preferably 70° C. to 130° C. The reaction time is, for example, 1 hour to 50 hours and preferably 2 hours to 12 hours.

The weight-average molecular weight of the polymer is, for example, 1000 to 100000 and preferably 1000 to 10000. When the value of the weight-average molecular weight is too large, the coating properties of the resist underlayer film forming composition for lithography of the present invention deteriorate. The polymer contained in the resist underlayer film forming composition for lithography of the present invention is in a proportion of, for example, 0.01% by mass to 3% by mass and preferably 0.1% by mass to 2% by mass per 100% by mass of the composition.

The weight-average molecular weight herein is a value obtained by gel permeation chromatography (GPC) with polystyrene as a reference material.

[Cross-Linking Agent]

The resist underlayer film forming composition for lithography of the present invention further includes a cross-linking agent. The cross-linking agent is not particularly limited but is preferably a nitrogen-containing compound having at least two cross-linking substituents (methylol groups, methoxymethyl groups, and butoxymethyl groups, for example).

Examples of the cross-linking agent include hexamethoxymethylmelamine, tetramethoxymethylbenzoguanamine, 1,3,4,6-tetrakis(methoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea. The cross-linking agent contained in the resist underlayer film forming composition for lithography of the present invention is in a proportion of, for example, 1% by mass to 100% by mass and preferably 10% by mass to 50% by mass per 100% by mass of the polymer in the composition. These cross-linking agents may cause a crosslinking reaction through self-condensation but can cause a crosslinking reaction with the polymer, in particular, the cross-linkable functional groups (hydroxy groups) in the structural units of formulae (2) and (3) that are structural units that react with cross-linking agents to form cross-links.

[Compound Promoting Cross-Linking Reaction]

The resist underlayer film forming composition for lithography of the present invention further includes a compound promoting a cross-linking reaction in order to promote a cross-linking reaction. Examples of such a compound available include sulfonic acid compounds and carboxylic acid compounds such as a p-toluenesulfonic acid, trifluoromethanesulfonic acid, pyridinium p-toluenesulfonate, salicylic acid, camphor sulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid. These compounds promoting a cross-linking reaction can be used alone or in combination of two or more thereof. The compound promoting a cross-linking reaction contained in the resist underlayer film forming composition for lithography of the present invention is in a proportion of, for example, 0.1% by mass to 25% by mass and preferably 1% by mass to 10% by mass per 100% by mass of the polymer in the composition.

[Organic Solvent]

The resist underlayer film forming composition for lithography of the present invention further includes an organic solvent. The organic solvent to be used in the present invention is not particularly limited so long as the solvent can dissolve the polymer described above. Examples of the organic solvent available include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monopropyl ether, 1-ethoxy-2-propanol, propylene glycol monomethyl ether acetate, propylene glycol propyl ether acetate, 1-methoxy-2-butanol, 2-methoxy-1-butanol, 3-methoxy-3-methylbutanol, 3-methoxy-1-butanol, toluene, xylene, methyl ethyl ketone, cyclopentanone, cyclohexanone, γ-butyrolactone, N-methyl-2-pyrrolidone, methyl 2-hydroxyisobutyrate, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents can be used alone or in combination of two or more thereof.

Among the organic solvents, preferable are propylene glycol monomethyl ether, propylene glycol monomethyl ether acetate, 1-ethoxy-2-propanol, ethyl lactate, butyl lactate, and cyclohexanone. The organic solvent contained in the resist underlayer film forming composition for lithography of the present invention is in a proportion of, for example, 90% by mass to 99.99% by mass and preferably 98% by mass to 99.9% by mass per 100% by mass of the composition.

[Acid Generator]

The resist underlayer film forming composition for lithography of the present invention may further include an acid generator. Examples of such an acid generator include bis(4-hydroxyphenyl) sulfone. When the resist underlayer film forming composition for lithography of the present invention includes the acid generator, the acid generator is contained in a proportion of, for example, 0.1% by mass to 5% by mass and preferably 0.2% by mass to 3% by mass per 100% by mass of the polymer in the composition.

[Other Additives]

The resist underlayer film forming composition for lithography of the present invention may further include various types of additives such as surfactants as necessary unless the additives impair the effects of the present invention. The surfactants are additives to improve the coating properties of the composition on a substrate. Known surfactants such as nonionic surfactants and fluorine-based surfactants are available.

Specific examples of the surfactants include nonionic surfactants polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octyl phenol ether and polyoxyethylene nonylphenol ether, polyoxyethylene-polyoxy propylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine-based surfactants such as EFTOP [registered trademark] EF301, EF303, and EF352 [manufactured by Mitsubishi Materials Electronic Chemicals Co., Ltd. (formerly JEMCO Inc.)], MEGAFAC [registered trademark] F171, F173, and R30 (manufactured by DIC Corporation), FLUORAD FC430 and FC431 (manufactured by Sumitomo 3M Limited), and ASAHIGUARD [registered trademark] AG710 and SURFLON [registered trademark] S-382, SC101, SC102, SC103, SC104, SC105, and SC106 (manufactured by Asahi Glass Co., Ltd.), and organosiloxane polymer KP341 (manufactured by Shin-Etsu Chemical Co., Ltd.). These surfactants may be added alone or in combination of two or more thereof.

When the resist underlayer film forming composition for lithography of the present invention includes such a surfactant, the surfactant is contained in a proportion of, for example, 0.1% by mass to 5% by mass and preferably 0.2% by mass to 3% by mass per 100% by mass of the polymer in the composition.

The method for forming a resist pattern of the present invention will be explained. First, the resist underlayer film forming composition for lithography of the present invention is applied with an appropriate applying means such as a spinner and a coater onto a substrate used in production of a precision integrated circuit device [a semiconductor substrate such as a silicon wafer coated with a silicon oxide film, a silicon nitride film, or a silicon oxide nitride film, a silicon nitride substrate, a quartz substrate, a glass substrate (including alkali-free glass, low alkali glass, and crystallized glass), and a glass substrate having an ITO film formed thereon, for example], and thereafter, the applied composition is baked with a heating means such as a hot plate and is cured to produce a resist underlayer film.

The conditions for the baking after the application is selected as appropriate from the ranges of, for example, a baking temperature of 80° C. to 250° C. and a baking time of 0.3 minutes to 60 minutes and preferably 150° C. to 250° C. and 0.5 minutes to 5 minutes. Baking in such a condition causes a reaction between a cross-linking moiety such as a hydroxy group in the structural unit of the polymer and a cross-linking agent to form a cross-linked structure. Particularly, by cross-linking the polymer contained in the resist underlayer film forming composition for lithography of the present invention, the cross-linked polymer with a high cross-linking density can be obtained. The film thickness of the resist underlayer film is, for example, 0.001 μm (1 nm) to 0.1 μm, preferably 0.001 μm to 0.02 m, and further preferably 0.003 μm to 0.01 μm.

Then, a resist film is formed on the produced resist underlayer film. The resist film can be formed by a typical method, that is, by applying a resist solution onto the resist underlayer film and baking the resultant. The resist solution to be applied is not particularly limited so long as the solution is photosensitive to, for example, a KrF excimer laser, an ArF excimer laser, EUV, and electron beams, and both negative type and positive type can be used. Examples of the resist solution available include trade name PAR710 and PAR855 manufactured by Sumitomo Chemical Company, Limited, trade name AR2772JN manufactured by JSR Corporation, trade name SEPR430 manufactured by Shin-Etsu Chemical Co., Ltd., and trade name APEX-X manufactured by The Dow Chemical Company (formerly Rohm and Haas Electronic Materials Company).

Subsequently, the resist film formed on the top of the resist underlayer film is exposed through a given mask (reticle). For example, a KrF excimer laser, an ArF excimer laser, and EUV are available in the exposure. However, a mask (reticle) is not required in exposure with electron beams. After the exposure, post exposure bake (PEB) may also be performed as needed. The conditions for the post exposure bake is selected as appropriate from the ranges of a baking temperature of 80° C. to 150° C. and a baking time of 0.3 minutes to 60 minutes.

After the exposure, the resultant film is developed, rinsed, and dried to produce a favorable resist pattern. Examples of a liquid developer available to the resist film include aqueous solutions of alkalis, for example, inorganic alkalis such as sodium hydroxide, potassium hydroxide, sodium carbonate, sodium silicate, sodium metasilicate, and ammonia solution, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide, and choline, and cyclic amines such as pyrrole and piperidine. Furthermore, the aqueous solutions of alkalis can also be used by being added with, for example, alcohols such as isopropyl alcohol and surfactants such as nonionic surfactants in an adequate amount. Among these, preferable liquid developers are the aqueous solutions of quaternary ammonium salts, and the aqueous solution of tetramethylammonium hydroxide is further preferable. The conditions for the development is selected as appropriate from the ranges of a developing temperature of 5° C. to 50° C. and a developing time of 10 seconds to 300 seconds.

The portion of the resist underlayer film from which the resist film is removed by the development in the process described above to be exposed to view is removed by dry etching, and a desired pattern can be formed on the substrate.

EXAMPLES

The present invention will be specifically described in synthesis examples and examples but is not limited to the descriptions.

The weight-average molecular weights indicated in Synthesis Examples 1 to 6 of the specification of the present invention are measurement results by gel permeation chromatography (abbreviated as GPC in the specification of the present invention, hereinafter). A GPC device manufactured by TOSOH CORPORATION is used in the measurement, and the measurement conditions are described below. The degrees of distribution indicated in the synthesis examples of the specification of the present invention are calculated from measured weight-average molecular weights and number-average molecular weights.

GPC column: Shodex [registered trademark]/Asahipak [registered trademark] (SHOWA DENKO K.K.)
Column temperature: 40° C.
Solvent: N,N-dimethylformamide (DMF)
Flow rate: 0.6 ml/min
Reference material: polystyrene (manufactured by TOSOH CORPORATION)
Detector: RI detector (RI-8020 manufactured by TOSOH CORPORATION)

Synthesis Example 1

5 g of terephthalic acid diglycidyl ester (trade name: DENACOL [registered trademark] EX711, manufactured by Nagase ChemteX Corporation), 3.146 g of 5-hydroxyisophthalic acid, 0.562 g of 3,5-di-tert-butylsalicylic acid hydrate, and 0.199 g of benzyltriethylammonium chloride were added to 35.6 g of propylene glycol monomethyl ether to be dissolved. The reaction container was purged with nitrogen, and then the mixture was allowed to react at 135° C. for 4 hours to produce a polymer solution. The polymer solution did not cause white turbidity and the like even after being cooled to room temperature and the polymer had favorable solubility in propylene glycol monomethyl ether. GPC analysis revealed that the polymer in the produced solution had a weight-average molecular weight of 6066 in terms of standard polystyrene and had a degree of distribution of 2.64.

Synthesis Example 2

5 g of terephthalic acid diglycidyl ester (trade name: DENACOL [registered trademark] EX711, manufactured by Nagase ChemteX Corporation), 3.146 g of 5-hydroxyisophthalic acid, 0.864 g of 3,5-di-tert-butylsalicylic acid hydrate, and 0.197 g of benzyltriethylammonium chloride were added to 36.8 g of propylene glycol monomethyl ether to be dissolved. The reaction container was purged with nitrogen, and then the mixture was allowed to react at 135° C. for 4 hours to produce a polymer solution. The polymer solution did not cause white turbidity and the like even after being cooled to room temperature and the polymer had favorable solubility in propylene glycol monomethyl ether. GPC analysis revealed that the polymer in the produced solution had a weight-average molecular weight of 4746 in terms of standard polystyrene and had a degree of distribution of 2.68.

Synthesis Example 3

5 g of terephthalic acid diglycidyl ester (trade name: DENACOL [registered trademark] EX711, manufactured by Nagase ChemteX Corporation), 3.146 g of 5-hydroxyisophthalic acid, 0.575 g of 3,5-diisopropylsalicylic acid hydrate, and 0.197 g of benzyltriethylammonium chloride were added to 35.7 g of propylene glycol monomethyl ether to be dissolved. The reaction container was purged with nitrogen, and then the mixture was allowed to react at 135° C. for 4 hours to produce a polymer solution. The polymer solution did not cause white turbidity and the like even after being cooled to room temperature and the polymer had favorable solubility in propylene glycol monomethyl ether. GPC analysis revealed that the polymer in the produced solution had a weight-average molecular weight of 5634 in terms of standard polystyrene and had a degree of distribution of 2.70.

Synthesis Example 4

5 g of terephthalic acid diglycidyl ester (trade name: DENACOL [registered trademark] EX711, manufactured by Nagase ChemteX Corporation), 3.146 g of 5-hydroxyisophthalic acid, 0.767 g of 3,5-diisopropylsalicylic acid hydrate, and 0.197 g of benzyltriethylammonium chloride were added to 35.7 g of propylene glycol monomethyl ether to be dissolved. The reaction container was purged with nitrogen, and then the mixture was allowed to react at 135° C. for 4 hours to produce a polymer solution. The polymer solution did not cause white turbidity and the like even after being cooled to room temperature and the polymer had favorable solubility in propylene glycol monomethyl ether. GPC analysis revealed that the polymer in the produced solution had a weight-average molecular weight of 4669 in terms of standard polystyrene and had a degree of distribution of 2.50.

Synthesis Example 5

5 g of terephthalic acid diglyeidyl ester (trade name: DENACOL [registered trademark] EX711, manufactured by Nagase ChemteX Corporation), 3.146 g of 5-hydroxyisophthalic acid, and 0.202 g of benzyltriethylammonium chloride were added to 35.6 g of propylene glycol monomethyl ether to be dissolved. The reaction container was purged with nitrogen, and then the mixture was allowed to react at 135° C. for 4 hours to produce a polymer solution. The polymer solution did not cause white turbidity and the like even after being cooled to room temperature and the polymer had favorable solubility in propylene glycol monomethyl ether. GPC analysis revealed that the polymer in the produced solution had a weight-average molecular weight of 15673 in terms of standard polystyrene and had a degree of distribution of 3.39.

Synthesis Example 6

5 g of terephthalic acid diglycidyl ester (trade name: DENACOL [registered trademark] EX711, manufactured by Nagase ChemteX Corporation), 3.146 g of 5-hydroxyisophthalic acid, 0.357 g of salicylic acid, and 0.202 g of benzyltriethylammonium chloride were added to 37.5 g of propylene glycol monomethyl ether to be dissolved. The reaction container was purged with nitrogen, and then the mixture was allowed to react at 135° C. for 4 hours to produce a polymer solution. The polymer solution did not cause white turbidity and the like even after being cooled to room temperature and the polymer had favorable solubility in propylene glycol monomethyl ether. GPC analysis revealed that the polymer in the produced solution had a weight-average molecular weight of 5745 in terms of standard polystyrene and had a degree of distribution of 2.67.

Example 1

0.4 g of a solution containing 0.07 g of the polymer produced in Synthesis Example 1 was mixed with 0.0184 g of tetramethoxymethyl glycoluril (trade name: POWDERLINK [registered trademark] 1174, manufactured by Nihon Cytec Industries Inc. [formerly Mitsui Cytec Ltd.]), and 0.0018 g of 5-sulfosalicylic acid. To the resultant mixture, 21.27 g of propylene glycol monomethyl ether and 9.33 g of 1-ethoxy-2-propanol were added to be dissolved. Subsequently, the resultant mixture was filtered through a polyethylene microfilter having a pore diameter of 0.05 μm to obtain a resist underlayer film forming composition for lithography.

Example 2

0.4 g of a solution containing 0.07 g of the polymer produced in Synthesis Example 2 was mixed with 0.0184 g of tetramethoxymethyl glycoluril (trade name: POWDERLINK [registered trademark] 1174, manufactured by Nihon Cytec Industries Inc. [formerly Mitsui Cytec Ltd.]), and 0.0018 g of 5-sulfosalicylic acid. To the resultant mixture, 21.27 g of propylene glycol monomethyl ether and 9.33 g of 1-ethoxy-2-propanol were added to be dissolved. Subsequently, the resultant mixture was filtered through a polyethylene microfilter having a pore diameter of 0.05 μm to obtain a resist underlayer film forming composition for lithography.

Example 3

0.4 g of a solution containing 0.07 g of the polymer produced in Synthesis Example 3 was mixed with 0.0184 g of tetramethoxymethyl glycoluril (trade name: POWDERLINK [registered trademark] 1174, manufactured by Nihon Cytec Industries Inc, [formerly Mitsui Cytec Ltd.]), and 0.0018 g of 5-sulfosalicylic acid. To the resultant mixture, 21.27 g of propylene glycol monomethyl ether and 9.33 g of 1-ethoxy-2-propanol were added to be dissolved. Subsequently, the resultant mixture was filtered through a polyethylene microfilter having a pore diameter of 0.05 μm to obtain a resist underlayer film forming composition for lithography.

Example 4

0.4 g of a solution containing 0.07 g of the polymer produced in Synthesis Example 4 was mixed with 0.0184 g of tetramethoxymethyl glycoluril (trade name: POWDERLINK [registered trademark] 1174, manufactured by Nihon Cytec Industries Inc. [formerly Mitsui Cytec Ltd.]), and 0.0018 g of 5-sulfosalicylic acid. To the resultant mixture, 21.27 g of propylene glycol monomethyl ether and 9.33 g of 1-ethoxy-2-propanol were added to be dissolved. Subsequently, the resultant mixture was filtered through a polyethylene microfilter having a pore diameter of 0.05 μm to obtain a resist underlayer film forming composition for lithography.

Comparative Example 1

0.4 g of a solution containing 0.07 g of the polymer produced in Synthesis Example 5 was mixed with 0.0184 g of tetramethoxymethyl glycoluril (trade name: POWDERLINK [registered trademark] 1174, manufactured by Nihon Cytec Industries Inc. [formerly Mitsui Cytec Ltd.]), and 0.0018 g of 5-sulfosalicylic acid. To the resultant mixture, 21.27 g of propylene glycol monomethyl ether and 9.33 g of 1-ethoxy-2-propanol were added to be dissolved. Subsequently, the resultant mixture was filtered through a polyethylene microfilter having a pore diameter of 0.05 μm to obtain a resist underlayer film forming composition for lithography.

Comparative Example 2

0.4 g of a solution containing 0.07 g of the polymer produced in Synthesis Example 6 was mixed with 0.0184 g of tetramethoxymethyl glycoluril (trade name: POWDERLINK [registered trademark] 1174, manufactured by Nihon Cytec Industries Inc. [formerly Mitsui Cytec Ltd.]), and 0.0018 g of 5-sulfosalicylic acid. To the resultant mixture, 21.27 g of propylene glycol monomethyl ether and 9.33 g of 1-ethoxy-2-propanol were added to be dissolved. Subsequently, the resultant mixture was filtered through a polyethylene microfilter having a pore diameter of 0.05 μm to obtain a resist underlayer film forming composition for lithography.

Comparative Example 3

A resist underlayer film forming composition was prepared that contained a copolymer of formula (5) below as a polymer and further contained, as additives, a crosslinking agent of formula (6) below and pyridinium p-toluenesulfonate.

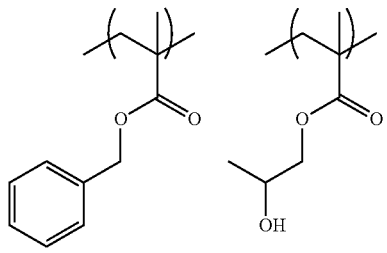

(5)

A/B = 50/50 (wt %)

-continued

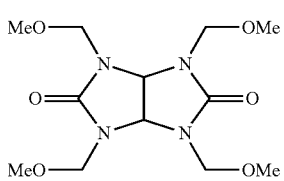
(6)

(Dissolution Test in Photoresist Solvent)

The resist underlayer film forming compositions prepared in Examples 1 to 4 and Comparative Examples 1 and 2 were applied onto respective silicon wafers serving as semiconductor substrates with a spinner. The resultant silicon wafers were placed on a hot plate and were baked at 205° C. for 1 minute to form resist underlayer films (each having a film thickness of 0.05 μm). These resist underlayer films were immersed into ethyl lactate and propylene glycol monomethyl ether that are solvents to be used in a photoresist, which verified that the films were insoluble in these solvents.

(Measurement of Dry Etching Rate)

The resist underlayer film forming compositions prepared in Examples 1 to 4 and Comparative Example 3 were applied onto respective silicon wafers with a spinner. The resultant silicon wafers were placed on a hot plate and were baked at 205° C. for 1 minute to form resist underlayer films (each having a film thickness of 0.10 μm), The dry etching rates of them were measured with RIE system ES401 manufactured by Nippon Scientific Co., Ltd.

In a similar manner, a resist solution (PAR855, manufactured by Sumitomo Chemical Co., Ltd.) was applied onto a silicon wafer with a spinner to form a resist film. The dry etching rate thereof was measured with RIE system ES401 manufactured by Nippon Scientific Co., Ltd. The measured dry etching rate was compared with the dry etching rates of the resist underlayer films produced from the resist underlayer film forming compositions prepared in Examples 1 to 4 and Comparative Example 3. Table 1 shows the result.

In Table 1, a selection ratio (resist underlayer film/resist film) of dry etching rate of the coating-type resist underlayer film according to the present invention to that of the resist film was measured using a $CF_4$ gas as an etching gas. The selection ratio of dry etching rate of the resist underlayer film produced from the resist underlayer film forming composition in each of the examples was larger than that of the resist underlayer film produced from the resist underlayer film forming composition in Comparative Example 3.

TABLE 1

|  | Selection ratio of dry etching rate |
| --- | --- |
| Example 1 | 1.6 |
| Example 2 | 1.6 |
| Example 3 | 1.5 |
| Example 4 | 1.5 |
| Comparative Example 3 | 1.1 |

(Measurement of Number of Defects after Application)

Figure 2:
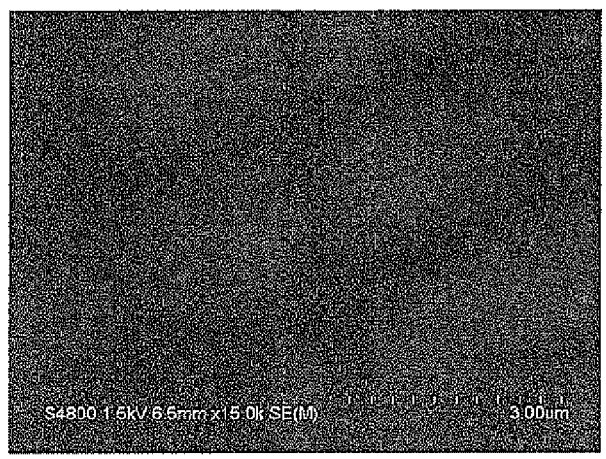
FIG. 2 is a FE-SEM image of a resist underlayer film formed from a composition prepared in Example 2.
Figure 3:
FIG. 3 is a FE-SEM image of a resist underlayer film formed from a composition prepared in Example 3.
Figure 4:
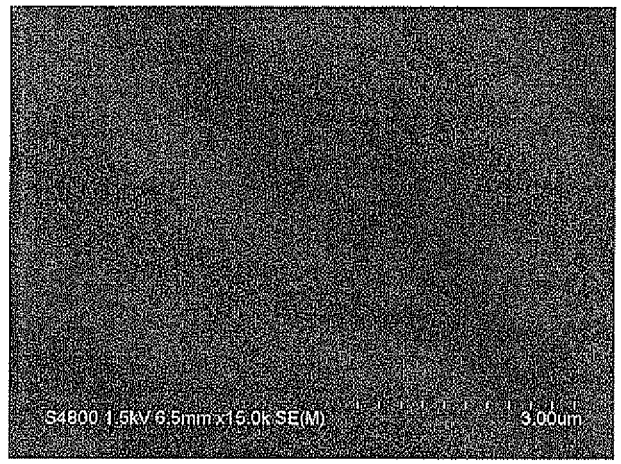
FIG. 4 is a FE-SEM image of a resist underlayer film formed from a composition prepared in Example 4.
Figure 5:
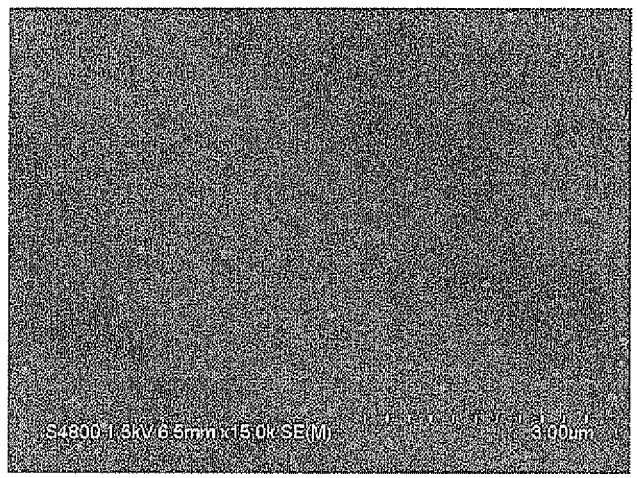
FIG. 5 is a FE-SEM image of a resist underlayer film formed from a composition prepared in Comparative Example 1.
Figure 6:
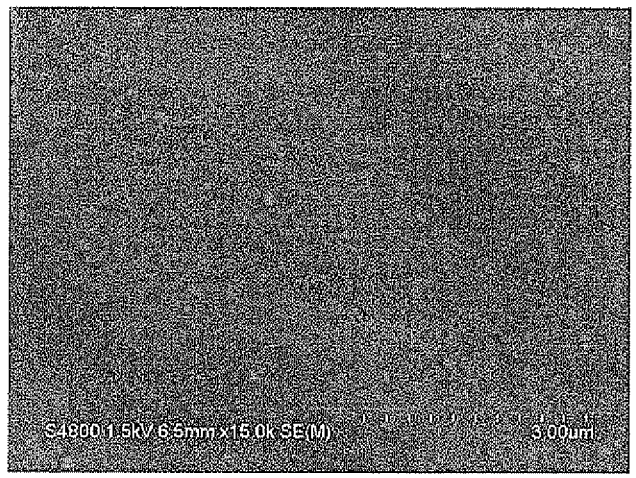
FIG. 6 is a FE-SEM image of a resist underlayer film formed from a composition prepared in Comparative Example 2.

The resist underlayer film forming compositions prepared in Examples 1 to 4 and Comparative Examples 1 and 2 were applied onto respective silicon wafers with a spinner. The resultant silicon wafers were placed on a hot plate and were baked at 205° C. for 1 minute to form resist underlayer films (each having a film thickness of 0.005 μm). The number of defects on the resist underlayer films that were observed as white spots through a high resolution field emission scanning electron microscope (FE-SEM) S-4800 manufactured by Hitachi High-Technologies Corporation was compared. Table 2 shows the result. In Table 2, the number of defects on the resist underlayer films was measured by counting the number of defects in the range of 16.7 μm×12.6 μm at a magnification of 15000×. FIGS. 1 to 6 show SEM images when the resist underlayer films formed from the compositions prepared in the examples and the comparative examples were observed from above through the FE-SEM.

TABLE 2

|  | Number of defects on resist underlayer film |
| --- | --- |
| Example 1 | 0 |
| Example 2 | 0 |
| Example 3 | 0 |
| Example 4 | 0 |
| Comparative Example 1 | 25 |
| Comparative Example 2 | 21 |

The invention claimed is:

1. A resist underlayer film forming composition for lithography, comprising:
   a polymer including a structure of formula (1) below at a terminal of a polymer chain;
   a cross-linking agent;
   a compound that promotes a cross-linking reaction; and
   an organic solvent:

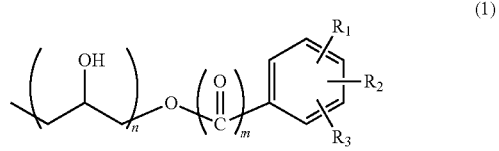
(1)

(where $R_1$, $R_2$, and $R_3$ are each independently a hydrogen atom, a linear or branched hydrocarbon group having a carbon atom number of 1 to 13, or a hydroxy group; at least one of $R_1$, $R_2$, and $R_3$ is the hydrocarbon group; m and n are each independently 0 or 1; and a main chain of the polymer is bonded to a methylene group when n is 1 and bonded to a group represented by —O— when n is 0).

2. The resist underlayer film forming composition for lithography according to claim 1, wherein the hydrocarbon group is a tert-butyl group or an iso-propyl group.

3. The resist underlayer film forming composition for lithography according to claim 1, wherein the polymer includes structural units of formulae (2) and (3):

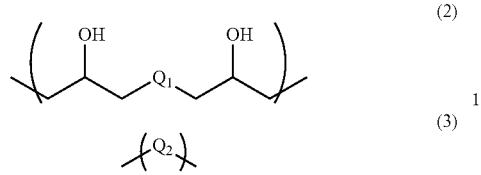

(where $Q_1$ and $Q_2$ are each independently a divalent organic group having a linear or branched hydrocarbon group having a carbon atom number of 1 to 13, a divalent organic group having an alicyclic hydrocarbon group, a divalent organic group having an aromatic ring or a heterocycle including 1 to 3 nitrogen atoms; and the hydrocarbon group, the alicyclic hydrocarbon group, the aromatic ring, and the heterocycle optionally have at least one substituent).

4. The resist underlayer film forming composition for lithography according to claim 3, wherein the structural unit of formula (2) is a structural unit of formula (2'):

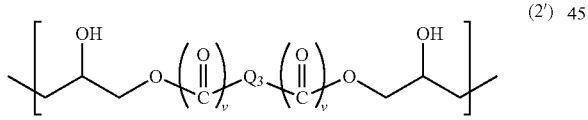

(where $Q_3$ is a linear or branched hydrocarbon group having a carbon atom number of 1 to 13, an alicyclic hydrocarbon group, or an aromatic ring; the hydrocarbon group, the alicyclic hydrocarbon group, and the aromatic ring optionally have at least one substituent; and two v are each independently 0 or 1).

5. The resist underlayer film forming composition for lithography according to claim 3, wherein the structural unit of formula (3) is a structural unit of formula (3'):

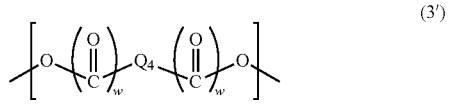

(where $Q_4$ is a linear or branched hydrocarbon group having a carbon atom number of 1 to 13, an alicyclic hydrocarbon group, or an aromatic ring; the hydrocarbon group, the alicyclic hydrocarbon group, and the aromatic ring optionally have at least one substituent; the hydrocarbon group optionally has one or two sulfur atoms and optionally has a double bond in a main chain of the hydrocarbon group; and two w are each independently 0 or 1).

6. The resist underlayer film forming composition for lithography according to claim 3, wherein the polymer is a polymer of formula (4):

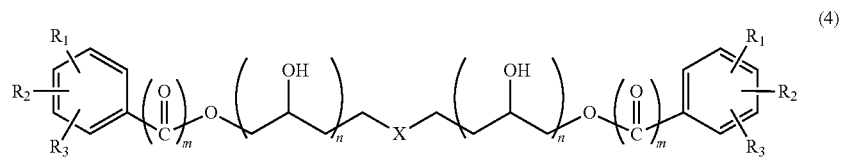

(where $R_1$, $R_2$, and $R_3$ mean the same as those of formula (1); two m and two n are each independently 0 or 1; and X is a polymer chain having the structural unit of formulae (2) and (3)).

7. The resist underlayer film forming composition for lithography according to claim 1, further comprising an acid generator.

8. The resist underlayer film forming composition for lithography according to claim 1, wherein the weight-average molecular weight of the polymer is 1000 to 100000.

9. A method for forming a resist pattern, the method comprising:
  applying the resist underlayer film forming composition for lithography as claimed in claim 1 onto a semiconductor substrate to be baked and forming a resist underlayer film having a thickness of 1 nm to 20 nm;
  forming a resist film on the resist underlayer film;
  exposing the semiconductor substrate coated with the resist underlayer film and the resist film to radiation selected from the group consisting of a KrF excimer laser, an ArF excimer laser, extreme ultraviolet rays, and electron beams; and
  performing development with an alkaline liquid developer after the exposing.

* * * * *